United States Patent [19]
Narukawa

[11] Patent Number: 5,978,943
[45] Date of Patent: Nov. 2, 1999

[54] APPLICATION SPECIFIED INTEGRATED CIRCUIT WITH USER PROGRAMMABLE LOGIC CIRCUIT

[75] Inventor: Toshiki Narukawa, Kasugai, Japan

[73] Assignee: Brother Kogyo Kabushiki Kaisha, Nagoya, Japan

[21] Appl. No.: 08/885,728

[22] Filed: Jun. 30, 1997

[30] Foreign Application Priority Data

Jun. 28, 1996 [JP] Japan .................................. 8-169643

[51] Int. Cl.⁶ ................................................ G01R 31/28
[52] U.S. Cl. ..................................... 714/725; 395/500.17
[58] Field of Search ............................... 371/22.2, 22.34, 371/22.5, 27.5, 27.6; 395/575, 500, 800, 828, 830, 834, 840, 182.06, 182.09, 183.19, 500.05, 500.17, 500.18; 364/578, 489, 490; 714/725, 25, 30, 33, 37, 43, 56, 733

[56] References Cited

U.S. PATENT DOCUMENTS

| | | | |
|---|---|---|---|
| 5,113,093 | 5/1992 | Tashiro et al. | 307/465 |
| 5,251,304 | 10/1993 | Sibigtrouth et al. | 395/375 |
| 5,416,919 | 5/1995 | Ogino et al. | 395/575 |
| 5,511,211 | 4/1996 | Akao et al. | 395/800 |
| 5,530,818 | 6/1996 | Tagawa | 395/401 |
| 5,537,601 | 7/1996 | Kimura et al. | 395/800 |
| 5,732,246 | 3/1998 | Gould et al. | 395/500 |
| 5,767,865 | 6/1998 | Inoue et al. | 345/519 |
| 5,771,361 | 6/1998 | Tokieda et al. | 395/311 |

*Primary Examiner*—Robert W. Beausoliel, Jr.
*Assistant Examiner*—Nadeem Iqbal
*Attorney, Agent, or Firm*—Oliff & Berridge, PLC

[57] ABSTRACT

A semiconductor integrated circuit enables an easy check of operations in a user logic section or of internal malfunction. A controller in an application specified integrated circuit (ASIC) includes a CPU, RAM, ROM and a user logic section which are mutually connected to one another. The ROM is connected to the user logic section through a first bus control circuit, and the RAM and CPU are connected thereto through a second bus control circuit. The first bus control circuit disconnects the ROM from the user logic section in accordance with a selection signal SA, and the second bus control circuit disconnects the RAM and CPU 16 from the user logic section in accordance with a mode selection signal SA1. Thus, three modes can be selectively set, which include a normal mode in which none of the CPU, RAM and ROM is disconnected, an external ROM mode in which only the ROM is disconnected, and an external CPU mode in which the ROM, RAM and CPU are disconnected. When the external CPU mode is set, the operational check of the user logic section can be performed.

21 Claims, 3 Drawing Sheets

SA0=1(High)
SA1=1(High)

SA0=0(Low)

SA1=0(Low)

APPLICATION SPECIFIED INTEGRATED CIRCUIT WITH USER PROGRAMMABLE LOGIC CIRCUIT

BACKGROUND OF THE INVENTION

1. Field of the Invention

The present invention relates to a semiconductor integrated circuit including a central processing unit (CPU), memories and a user programmable logic circuit mutually connected to one another through internal buses.

2. Description of the Prior Art

Conventionally, there has been known an application specified integrated circuit (hereinafter referred to as "ASIC") provided with a user logic section including a logic circuit programmed by a user to meet with a specified application or special purpose. To accomplish a higher level function, some of the ASICs incorporate CPU and memories therein. When it is designed so that the ASCI operates in accordance with a control signal issued from the CPU incorporated in the ASCI, operation of the user logic section cannot be achieved externally. This results in difficulty in testing the operations of the user logic section per se. Further, when there is a malfunction in such an ASIC, it has been difficult to know which component of the CPU, memories, user logic section is suffering from the malfunction.

SUMMARY OF THE INVENTION

The present invention has been made to solve the above-mentioned problems, and accordingly it is an object of the present invention to provide a semiconductor integrated circuit wherein operation of a user logic section can be readily tested and a malfunctioning internal component in the user logic section can be easily specified.

To achieve the above and other objects, there is provided an integrated semiconductor circuit which includes a central processing unit, storage means for storing data therein, a programmable logic section, prohibiting means, and external terminals for inputting and outputting external signals. The central processing unit, the storage means and the programmable logic section are mutually connected to one another with internal buses. The prohibiting means prohibits first signals from being input from the central processing unit and the storage means to the programmable logic section. Also, the prohibiting means prohibits the first signals from being output from the programmable logic section to the central processing unit and the storage means. The external signals applied through the external terminals are equivalent to the first signals input to and output from the programmable logic section.

Signal switching means is further provided for switching connections of the external terminals to the programmable logic section so that second signals are input from the external terminals to the programmable logic section and output from the programmable logic section to the external terminals.

The programmable logic section includes a plurality of processing blocks which are cascade-connected to one another and sequentially execute predetermined processings of input data applied to the programmable logic section upon receipt of processing data from preceding processing block. Also, a plurality of selection means are provided, each connected betweentwo successive processing blocks, for selecting either one of the external data applied through the external terminals and the processing data from the preceding processing block.

Specifically, the plurality of processing blocks includes a data receiving circuit which receives image data and transfers the image data to an external memory externally provided to the integrated semiconductor circuit, and a line buffer which retrieves the image data from the external memory and converts the image data to serial data. The integrated semiconductor circuit is used as a controller of an image forming device, such as a printer.

The plurality of processing blocks may include a data receiving circuit which receives compressed image data and transfers the compressed image data to an external memory externally provided to the integrated semiconductor circuit, a decompressing circuit which retrieves the compressed image data from the external memory and decompresses the compressed image data to reproduce image data, and a line buffer which receives the image data from the decompressing circuit and converts the image data to serial data.

According to another aspect of the invention, there is provided an integrated semiconductor circuit which includes a central processing unit, a read-only memory, a random access memory, a programmable logic section, a first control circuit, a second control circuit, and external terminals. The first control circuit selectively connects the read-only memory to the programmable logic section. The second control circuit selectively connects the random access memory and the central processing unit to the programmable logic section. The external terminals are provided to input external signals to the programmable logic section and output internal signals obtained from the programmable logic circuit.

A mode selection circuit is further provided for controlling the first control circuit and the second control circuit. The mode selection circuit is operated in accordance with mode selection signals produced externally of the integrated semiconductor circuit. In this case, the mode selection circuit controls the first control circuit and the second control circuit to be one of a first mode in which all of the read-only memory, the random access memory, and the central processing unit are connected to the programmable logic section, a second mode in which only the read-only memory is disconnected from the programmable logic section, and a third mode in which all of the read-only memory, the random access memory, and the central processing unit are disconnected from the programmable logic section.

Signal switching means is further provided for switching connections of the external terminals to the programmable logic section so that external signals are input from the external terminals to the programmable logic section and that output signals from the programmable logic section are output to the external terminals.

BRIEF DESCRIPTION OF THE DRAWINGS

The particular features and advantages of the invention as well as other objects will become apparent from the following description taken in connection with the accompanying drawings, in which.

DETAILED DESCRIPTION OF THE PREFERRED EMBODIMENT

A preferred embodiment of the present invention will be described while referring to the accompanying drawings.

Figure 1:
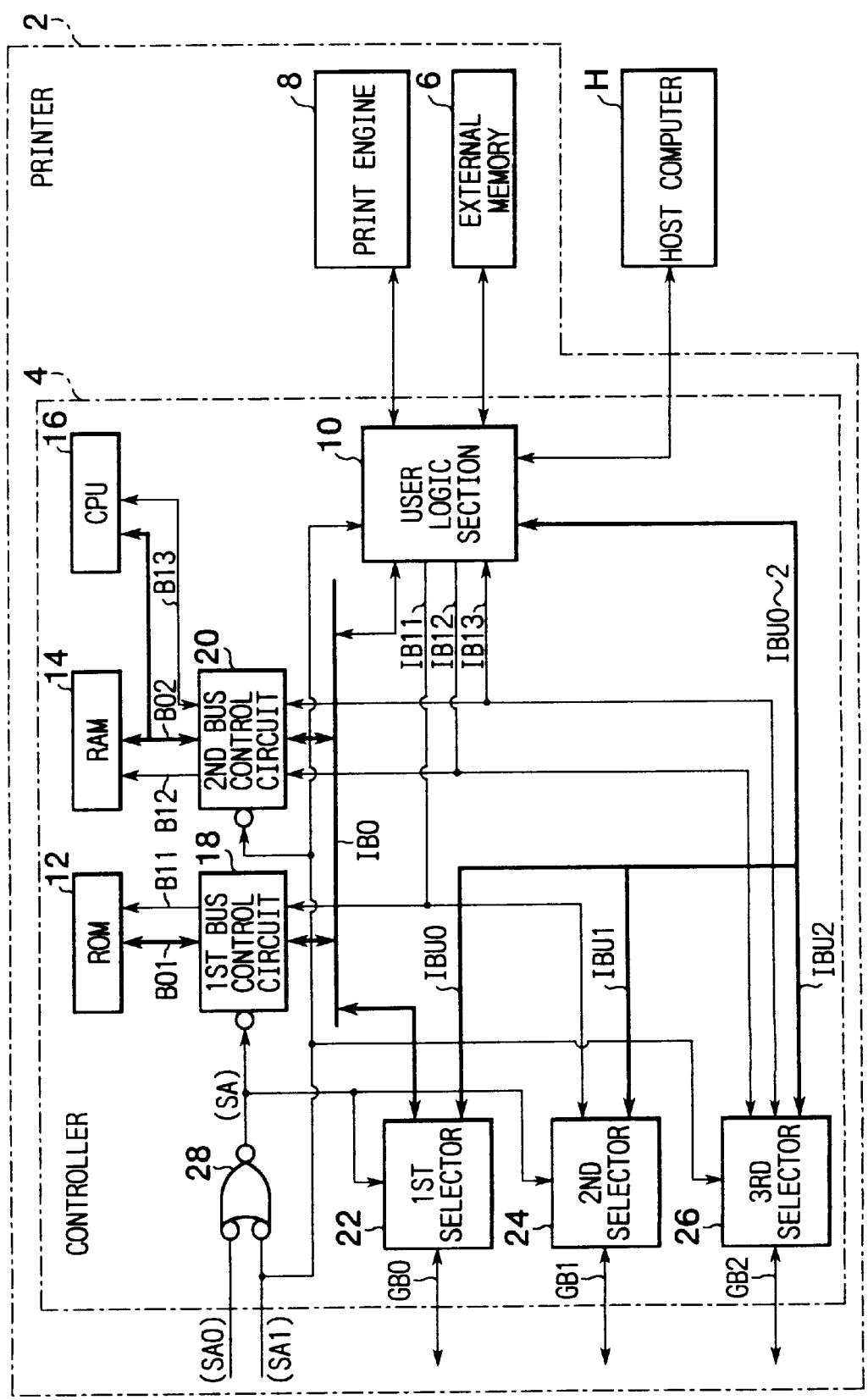
FIG. 1 is a block diagram showing an internal arrangement of the ASIC according to a preferred embodiment of the present invention and also an arrangement of a laser printer constructed with the ASIC.

FIG. 1 shows an internal arrangement of the ASIC to be used as a controller of a laser printer. FIG. 1 also shows an entire arrangement of the laser printer using the ASIC as the controller. As shown in FIG. 1, the laser printer 2 receives image data PD from an external host computer H. The laser printer 2 includes a controller 4 which converts the image data PD to a serial video signal VD, an external memory 6 which temporarily stores the image data PD received by the controller 4, and a print engine 8 which carries out printing images on a printing medium based on the video signal VD output from the controller 4.

The controller 4 is constructed with an ASIC which incorporates therein a user programmable logic section 10, a read-only memory (ROM) 12, a random access memory (RAM) 14, and a central processing unit (CPU) 16. The CPU 16 has a 8-bit data bus and 16-bit address bus. The ROM 12 has a 32 Kbyte storage capacity, and RAM 14 a 512 byte storage capacity.

The controller 4 includes two bus control circuits 18 and 20. The bus control circuit 18 connects an address data bus B01 and a ROM bus B11 to an internal address data bus IB0 and an internal ROM bus IB 11, respectively. The address data bus B01 is connected to the ROM 12. The ROM bus B11 consists of various kinds of ROM control signal lines. The internal address data bus IB0 and the internal ROM bus IB 11 are connected to the user logic section 10. Another bus control circuit 20 connects an address data bus B02 and a RAM bus B12, and a CPU bus B13 to the internal address data bus IB0, an internal RAM bus IB 12, and an internal CPU bus IB13, respectively, which are connected to the user logic section 10. The address bus B02 is connected to both the RAM 14 and the CPU 16. The RAM bus B12 consists of various kinds of RAM control signal lines. The CPU bus B13 consists of various kinds of CPU control signal lines.

The controller 4 further includes a first selector 22, a second selector 24, and a third selector 26. The first selector 22 connects selective one of the internal address data bus IB0 and a general-purpose I/O bus IBU0 to an external bus GB0. The general-purpose I/O bus IBU0 consists of various kinds of general-purpose signal lines connected to the user logic section 10. The external bus GB0 consists of external signal lines connected to an external terminal. The second selector 24 connects selective one of the internal ROM bus IB11 and a general-purpose I/O bus IBU1 to an external bus GB1. The third selector 26 connects selective one of the internal RAM bus IB12, the internal CPU bus IB13, and a general-purpose I/O bus IBU2 to an external bus GB2.

The controller 4 further includes an AND circuit 28 having two inputs applied with mode selection signals SA0 and SA1 which are input to the controller 4 through prescribed external terminals thereof. The AND circuit 28 outputs a selection signal SA which is applied to the first bus control circuit 18, and the first and second selectors 22 and 24 for controlling the same. The mode selection signal SA1 is directly applied to the second bus control circuit 20 and the third selector 26 for controlling the same.

When at least one of the mode selection signals SA0 and SA1 is at a low level, the first bus control circuit 18 disconnects the address data bus B01 and the ROM bus B11 from the internal address data bus IB0 and the internal ROM bus IB 11, respectively, and the first and second selectors 22 and 24 connect the internal address bus IB0 and the internal ROM bus IB 11 to the external buses GB0 and GB1, respectively. When the mode selection signal SA1 is at the low level, the second bus control circuit 20 disconnects the address data bus B02, RAM bus B12 and CPU bus B13 from the internal address data bus IB0, internal RAM bus IB12 and internal CPU bus IB13, respectively, and the third selector 26 connects the internal RAM bus IB12 and the internal CPU bus IB13 to the external bus GB2. When both the mode selection signals SA0 and SA1 are at a high level, the first and second bus control circuits 18 and 20 connect the address data bus B01, ROM bus B11, RAM bus B12, address data bus B02 and CPU bus B13 to the internal buses IB, IB11, IB12, IB0 and IB13, respectively, and the first to third selectors 22, 24 and 26 connect the general-purpose I/O buses IBU0 through IBU2 to the external buses GB0 through GB2, respectively.

Figure 2:
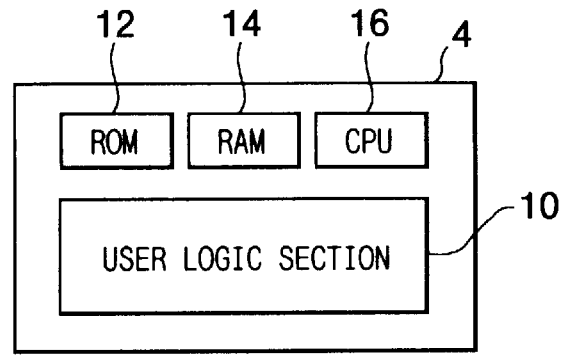
FIGS. 2(a) through 2(c) are explanatory diagrams for describing operational modes of the ASIC.
Figure 2:
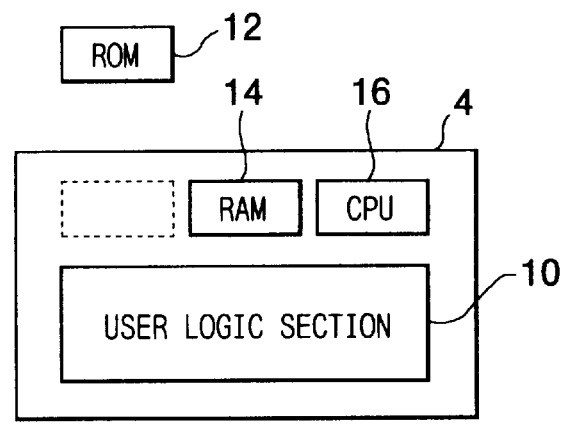
Figure 2:
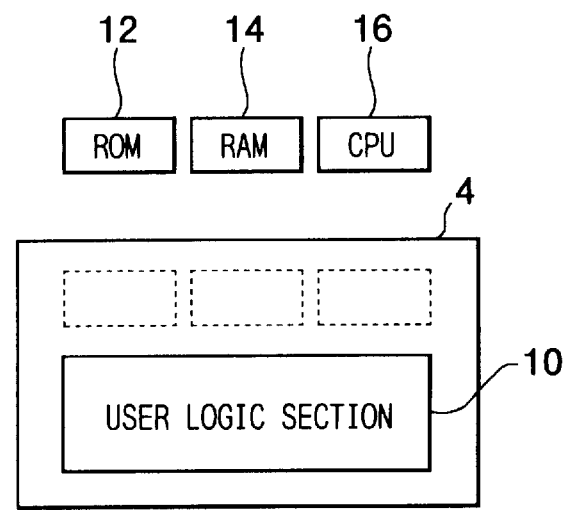

The controller 4 thus arranged operates in three modes, i.e., in a normal mode, an external ROM mode and an external CPU mode. The controller 4 operates in the normal mode when the mode selection signals SA0 and SA1 are at the high level. As shown in FIG. 2(a), in the normal mode the user logic section 10, the ROM 12, RAM 14 and CPU 16 are mutually connected to one another through the internal buses IB0 and IB11 through IB13 (hereinafter referred to as "IBx"). General-purpose I/O signals are input and output from the external terminals connected to the external buses GB0 through GB2.

The controller 4 operates in the external ROM mode when the mode selection signal SA0 is at the low level. In the external ROM mode, as shown in FIG. 2(b), the ROM 12 is disconnected from the internal buses IBx and address data signal and external signal corresponding to the ROM control signal are input and output from the external terminals connected to the external buses GB0 and GB1. Accordingly, the ROM 12 incorporated in the controller 4 cannot be used in the external ROM mode, however, the external ROM mode can operate in substantially the same fashion as in the normal move, provided that a ROM is externally connected to the external terminals connected to the external buses GB0 and GB1.

On the other hand, the controller 4 operates in the external CPU mode when the mode selection signal SA1 is at the low level. As shown in FIG. 2(c), in the external CPU mode, the ROM 12, RAM 14 and CPU 16 are disconnected from the internal buses IBx and external signals corresponding to an address data signal, ROM control signal, RAM control signal and CPU control signal can be input and output from the external terminals connected to the external buses GB0 through GB2. Accordingly, in the external CPU mode, the ROM 12, RAM 14 and CPU 16 which are incorporated in the controller 4 cannot be used, however, the user logic section 10 can be operated alone without passing through the CPU 16. Further, the external CPU mode can be operated in substantially the same fashion as in the normal mode provided that the ROM, RAM and CPU are externally connected to the external terminals connected to the external buses GB0 through GB2.

Except for the power source terminals, the controller 4 is provided with about 100 pins of external terminals which are used for input and output of various signals. About 60 pins of those are used as cleared terminals for input and output of fixed signals regardless of the operation mode. The remaining 40 pins are connected to external buses GB0 through GB2 and serve as common terminals which input and output signals which vary depending on the operation mode.

The clear terminals are assigned to the signals which are highly important for the processing of the user logic section 10. Such signals include signals used in the interfaces for the host computer H, external memory 6, print engine 8. On the other hand, the common terminals are assigned to the signals which are less important for the processing of the user logic section 10 and are not frequently used. Such signals include driving signals applied to display devices which may be constructed with LEDs, and input signals to switches which are also settable with commands issued from the host computer H.

Figure 3:
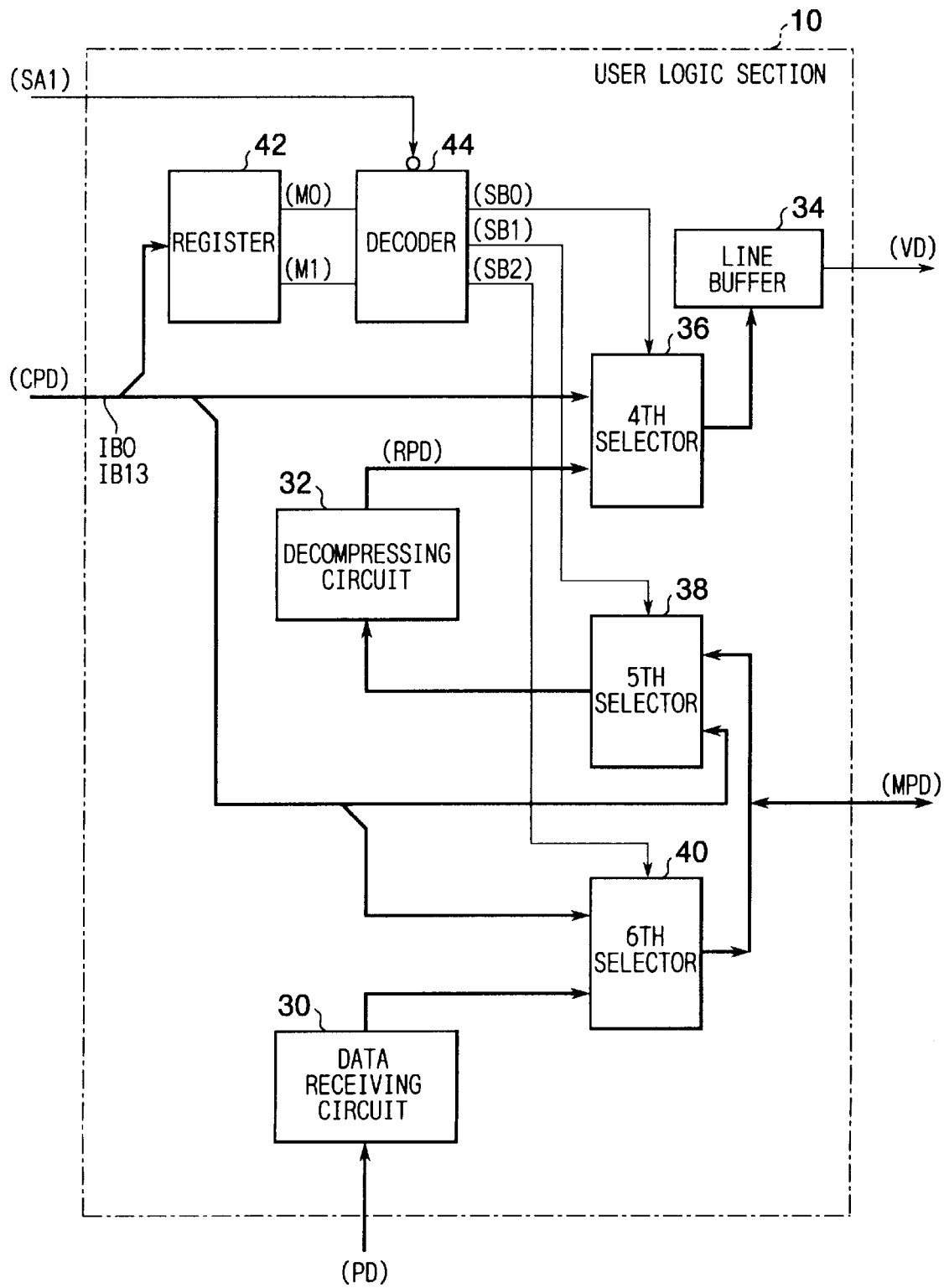
FIG. 3 is a block diagram showing an internal arrangement of a user logic section.

FIG. 3 shows a block diagram showing a part of the internal arrangement of the user logic section 10. The user logic section 10 includes a data processing portion for processing image data received from the host computer H, and a signal generation processing portion for generating various control signals for the control of a print engine 8. For the sake of brevity, FIG. 3 shows only the arrangement of the data processing portion.

As shown in FIG. 3, the data processing portion in the user logic section 10 includes a data receiving circuit 30, a decompressing circuit 32 and a line buffer 34. The data receiving circuit 30 receives compressed image data PD compressed according to a predetermined format from the host computer H, and transfers the same to the external memory 6. The decompressing circuit 32 decompresses the compressed image data MPD stored in the external memory 6 to printable data. The line buffer 34 reads, on a line basis, the decompressed image data RPD supplied from the decompressing circuit 32, and outputs, on a bit basis, one line's worth of the decompressed image data in timed relation with the timing signals (not shown) fed from the print engine 8 to thereby convert the decompressed image data RPD to a video signal VD in the form of serial data. The thus produced video signal VD is supplied to the print engine 8.

The data processing portion in the user logic section 10 further includes a fourth selector 36, a fifth selector 38, a sixth selector 40, a register 42 and a decoder 44. The fourth selector 36 supplies selective one of the decompressed image data RPD and the external data CPD to the line buffer 34 in accordance with the selection signal SB0. The decompressed image data RPD is from the decompressing circuit 32 and the external data CPD is input from the external terminals and supplied to the fourth selector 36 through the internal address data bus IB0. The fifth selector 38 supplies selective one of the decompressed image data RPD stored in the external memory 6 and the external data CPD to the decompressing circuit 32 in accordance with the selection signal SB1. The external data CPD is supplied through the internal address data bus IB0. The sixth selector 40 supplies selective one of the compressed image data PD received at the data receiving circuit 32 from the host computer H and the external data CPD supplied through the internal address data bus IB0 to the external memory 6 in accordance with the selection signal SB2. The register 42 stores DP mode selection signals M0 and M1 which determine the operational mode of the data processing portion. The decoder 44 produces the selection signals SB0 through SB2 in accordance with the DP mode selection signals M0 and M1 stored in the register 42.

The fourth to sixth selectors 36, 38 and 40 select the data from the decompressing circuit 32, external memory 6 and data receiving circuit 30, respectively, when the selection signals SB0 through SB2 are not applied to the selectors 36, 38 and 40. When the selection signals SB0 through SB2 are applied thereto, the selectors 36, 38 and 40 select and output the external data CPD supplied through the internal address data bus IB0.

The decoder 44 operates properly when the mode selection signal SA1 is at the low level and the operation mode of the controller 4 is set to the external CPU mode, that is, only when the user logic section 10 is operable by itself. The decoder 44 selectively outputs one of the selection signals SB0 through SB2 in accordance with the DP mode selection signals M0 and M1. The DP mode selection signals M0 and M1 are written in the register 42 through the external terminals which can input signals to and output signals from the internal address data bus IB0 and the CPU bus IB13.

In the data processing portion in the user logic section 10 thus arranged, the selection signals SB0 through SB2 are not output therefrom when the mode selection signal SA1 is at the high level, that is, when the operation mode of the controller 4 is in the normal mode or the external ROM mode. Each of the processing blocks operates upon input of signals from the preceding processing block or external memory 6.

More specifically, the decompressing circuit 32 is activated when the data receiving circuit 30 transfers the compressed image data PD received from the host computer H to the external memory 6 and the latter stores one page worth of or a predetermined amount of compressed image data in the external memory 6. The decompressing circuit 32 decompresses the compressed image data MPD stored in the external memory 6 while sequentially retrieving the compressed image data MPD from the external memory 6, and transfers the resultant data on a line basis in accordance with a write request from the line buffer 34. The line buffer 34 outputs the image data on a bit basis in accordance with the timing signal from the print engine 8. When the one line's worth of data is output, the line buffer 34 sends out another write request to the decompressing circuit 32 to send the subsequent one line's worth of data. In this manner, the compressed image data PD transferred from the host computer H is supplied to the print engine 8 as the video signal VD, and the print engine 8 carries out printing on a recording medium based on the video signal VD.

When the mode selection signal SA1 is at the low level, that is, when the operation mode of the controller 4 is in the external CPU mode, the selection signals SB0 and SB1 are produced and the external data CPD are allowed to be supplied to the interfaces for the line buffer 34, decompressing circuit 32 and external memory 6. More specifically, when the DP mode selection signals M0 and M1 are set so that the selection signal SB0 is produced, the fourth selector 36 disconnects the decompressing circuit 32 from the line buffer 34, thereby allowing desired external data CPD to supply to the line buffer 34. Therefore, the operation of the line buffer 34 can be checked.

When the DP mode selection signals M0 and M1 are set so as to produce the selection signal SB1, the fifth selector 38 disconnects the interface for the external memory 6 from the decompressing circuit 32, thereby allowing desired external data CPD to supply to the decompressing circuit 32. Therefore, operations of the decompressing circuit and the line buffer 34 can be checked.

When the DP mode selection signals M0 and M1 are set so as to produce the selection signal SB2, the sixth selector 40 disconnects the interface for the external memory 6 from the data receiving circuit 30, thereby allowing desired external data CPD to the interface for the external memory 6. Therefore, it becomes possible to check the operations in the portion excluding the data receiving circuit 30. This means that the malfunction of the data receiving circuit 30 can be checked.

When the DP mode selection signals M0 and M1 are set so that none of the selection signals SB0 through SB2 are produced, the operation is similar to the case in which the mode selection signal SA1 is set to the high level.

As described above, the controller according to this embodiment receives the compressed image data PD from the host computer H and decompresses the same to provide the video signal VD to be applied to the print engine 8. Because the data temporarily stored in the external memory 6 has been compressed, the storage capability of the external memory 6 can be made small.

In the controller 4 of the preferred embodiment, by setting its operation mode to the external CPU mode, the ROM 12, RAM 14 and CPU 16 are disconnected from the internal bus IBx and signals corresponding to the address data signal, ROM control signal, RAM control signal, and CPU control signals can be input to and output from the user logic section 10 through external terminals. Accordingly, the controller 4 can operate the user logic section 10 without need for the CPU 16, and also an emulator or the like can be connected to the user logic section 10 through the external terminals. As a result, operation of the user logic section 10 can be readily checked, and debug of the user logic section 10 can be performed quickly and also the malfunctioning portions (either the user logic section 10 or the portions other than the user logic section 10) can be specified quickly.

Furthermore, in the user logic section 10 of the controller 4, the selectors 36, 38 and 40 are provided between the successive processing blocks, such as interfaces of the line buffer 34, decompressing circuit 32, and external memory, and the data receiving circuit 30. When the operation mode of the controller 4 is set to the external CPU mode, arbitrary external data is input through the external terminals instead of inputting data from the preceding processing block, so that operational check can be done under the condition in which the processing block preceding to the subject processing block is disconnected. Accordingly, operations in the line buffer 34 alone, in the portion including the line buffer 34 and decompressing circuit 32, and in the portion excluding the data receiving circuit 30 can be checked sequentially. By doing so, malfunction in those portions can be checked on a basis of each processing block. Accordingly, the debug in the interior of the user logic section 10 can be specified quickly. Also, when a malfunction occurs in the interior of the user logic section 10, the processing block which causes the malfunction can be specified quickly.

By setting the controller 4 to the external ROM mode, only the ROM 12 is disconnected from the internal buses IBx and external signals corresponding to the address data signal and the ROM control signal can be input to and output from the user logic section 10 through the external terminals. Accordingly, at a time of debug when the contents of the program is frequently changed, the program is run while storing it in an easily rewritable external memory, and when the debug is terminated, the program is written in the internally provided ROM 12. In this manner, the debug can be accomplished effectively.

When the operation mode of the controller 4 is set to either the external ROM mode or the external CPU mode, the external terminals for input and output of the external signals corresponding to the address data signal, ROM control signal, RAM control signal and the CPU control signal are used for input and output of the general-purpose I/O signals from the user logic section 10 and so are used as common terminals. Accordingly, the controller 4 of the preferred embodiment has a reduced number of external terminals as compared with the case in which clear terminals are provided for input and output only the external signals. This can make the chip to a compact size.

While only one exemplary embodiment of this invention has been described in detail, those skilled in the art will recognize that there are many possible modifications and variations which may be may in this exemplary embodiment while yet retaining many of the novel features and advantages of the invention. Accordingly, all such modifications and variations are intended to be included within the scope of the appended claims.

What is claimed is:

1. An integrated semiconductor circuit comprising:

a central processing unit;

storage means for storing data therein;

a programmable logic section that is programmed by a user to meet with a specified application, said central processing unit, said storage means and said programmable logic section being mutually connected to one another with internal buses;

prohibiting means for prohibiting first signals from being input from said central processing unit and said storage means to said programmable logic section and from being output from said programmable logic section to said central processing unit and said storage means; and external terminals for inputting and outputting external signals equivalent to said first signals input to an output from said programmable logic section.

2. The integrated semiconductor circuit according to claim 1, further comprising signal switching means for switching connections of said external terminals to said programmable logic section so that second signals are input from said external terminals to said programmable logic section and output from said programmable logic section to said external terminals.

3. The integrated semiconductor circuit according to claim 1, wherein said programmable logic section comprises a plurality of processing blocks which are connected one after another and sequentially execute predetermined processings of input data applied to said programmable logic section upon receipt of processing data from preceding processing block, and a plurality of selection means, each connected between two successive processing blocks, for selecting either one of the external data applied through said external terminals and the processing data from said preceding processing block.

4. The integrated semiconductor circuit according to claim 3, wherein said plurality of processing blocks comprise:

a data receiving circuit which receives image data and transfers the image data to an external memory externally provided to said integrated semiconductor circuit; and a line buffer which retrieves the image data from said external memory and converts the image data to serial data, wherein said integrated semiconductor circuit is used as a controller of an image forming device.

5. The integrated semiconductor circuit according to claim 3, wherein said plurality of processing blocks comprise:

a data receiving circuit which receives compressed image data and transfers the compressed image data to an external memory externally provided to said integrated semiconductor circuit;

a decompressing circuit which retrieves the compressed image data from said external memory and decompresses the compressed image data to reproduce image data; and a line buffer which receives the image data from said decompressing circuit and converts the image data to serial data, wherein said integrated semiconductor circuit is used as a controller of an image forming device.

6. An integrated semiconductor circuit comprising:

a central processing unit;

a read-only memory;

a random access memory;

a programmable logic section that is programmed by a user to meet with a specified application;

a first control circuit which selectively connects said read-only memory to said programmable logic section;

a second control circuit which selectively connects said random access memory and said central processing unit to said programmable logic section; and external terminals for inputting external signals to said programmable logic section and outputting internal signals obtained from said programmable logic circuit.

7. The integrated semiconductor circuit according to claim 6, further comprising a mode selection circuit for controlling said first control circuit and said second control circuit, said mode selection circuit being operated in accordance with mode selection signals produced externally of said integrated semiconductor circuit.

8. The integrated semiconductor circuit according to claim 7, wherein said mode selection circuit controls said first control circuit and said second control circuit to be one of a first mode in which all of said read-only memory, said random access memory, and said central processing unit are connected to said programmable logic section, a second mode in which only said read-only memory is disconnected from said programmable logic section, and a third mode in which all of said read-only memory, said random access memory, and said central processing unit are disconnected from said programmable logic section.

9. The integrated semiconductor circuit according to claim 6, further comprising signal switching means for switching connections of said external terminals to said programmable logic section so that external signals are input from said external terminals to said programmable logic section and that output signals from said programmable logic section are output to said external terminals.

10. The integrated semiconductor circuit according to claim 6, wherein said programmable logic section comprises a plurality of processing blocks which are connected to one after another and sequentially execute predetermined processings of input data applied to said programmable logic section upon receipt of processing data from preceding processing block, and a plurality of selectors, each connected between two successive processing blocks, for selecting either one of the external data applied through said external terminals and the processing data from said preceding processing block.

11. The integrated semiconductor circuit according to claim 9, wherein said plurality of processing blocks comprise:

a data receiving circuit which receives image data and transfers the image data to an external memory externally provided to said integrated semiconductor circuit; and a line buffer which retrieves the image data from said external memory and converts the image data to serial data, wherein said integrated semiconductor circuit is used as a controller of an image forming device.

12. The integrated semiconductor circuit according to claim 8, wherein said plurality of processing blocks comprise:

a data receiving circuit which receives compressed image data and transfers the compressed image data to an external memory externally provided to said integrated semiconductor circuit;

a decompressing circuit which retrieves the compressed image data from said external memory and decompresses the compressed image data to reproduce image data; and a line buffer which receives the image data from said decompressing circuit and converts the image data to serial data, wherein said integrated semiconductor circuit is used as a controller of an image forming device.

13. An integrated semiconductor circuit comprising:

a central processing unit;

a read-only memory;

a random access memory;

a programmable logic section that is programmed by a user to meet with a specified application which includes a data receiving circuit which receives image data and transfers the image data to an external memory externally provided to said integrated semiconductor circuit, and a line buffer which retrieves the image data from said external memory and converts the image data to serial data;

a first control circuit which selectively connects said read-only memory to said programmable logic section;

a second control circuit which selectively connects said random access memory and said central processing unit to said programmable logic section; and external terminals for inputting external signals to said programmable logic section and outputting internal signals obtained from said programmable logic circuit.

14. The integrated semiconductor circuit according to claim 13, further comprising a mode selection circuit for controlling said first control circuit and said second control circuit, said mode selection circuit being operated in accordance with mode selection signals produced externally of said integrated semiconductor circuit.

15. The integrated semiconductor circuit according to claim 14, wherein said mode selection circuit controls said first control circuit and said second control circuit to be one of a first mode in which all of said read-only memory, said random access memory, and said central processing unit are connected to said programmable logic section, a second mode in which only said read-only memory is disconnected from said programmable logic section, and a third mode in which all of said read-only memory, said random access memory, and said central processing unit are disconnected from said programmable logic section.

16. The integrated semiconductor circuit according to claim 13, further comprising signal switching means for switching connections of said external terminals to said programmable logic section so that external signals are input from said external terminals to said programmable logic section and that output signals from said programmable logic section are output to said external terminals.

17. The integrated semiconductor circuit according to claim 13, wherein said programmable logic section further includes a selector connected between said data receiving circuit and said line buffer for selecting either the external data applied through said external terminals or the image data.

18. An integrated semiconductor circuit comprising:

a central processing unit;

a read-only memory;

a random access memory;

a programmable logic section that is programmed by a user to meet with a specified application which includes a data receiving circuit which receives compressed image data and transfers the compressed image data to an external memory externally provided to said integrated semiconductor circuit, a decompressing circuit which retrieves the compressed image data from said external memory and decompresses the compressed image data to reproduce image data, and a line buffer which receives the image data from said decompressing circuit and converts the image data to serial data;

a first control circuit which selectively connects said read-only memory to said programmable logic section;

a second control circuit which selectively connects said random access memory and said central processing unit to said programmable logic section; and external terminals for inputting external signals to said programmable logic section and outputting internal signals obtained from said programmable logic circuit.

19. The integrated semiconductor circuit according to claim 18, further comprising a mode selection circuit for controlling said first control circuit and said second control circuit, said mode selection circuit being operated in accordance with mode selection signals produced externally of said integrated semiconductor circuit.

20. The integrated semiconductor circuit according to claim 19, wherein said mode selection circuit controls said first control circuit and said second control circuit to be one of a first mode in which all of said read-only memory, said random access memory, and said central processing unit are connected to said programmable logic section, a second mode in which only said read-only memory is disconnected from said programmable logic section, and a third mode in which all of said read-only memory, said random access memory, and said central processing unit are disconnected from said programmable logic section.

21. The integrated semiconductor circuit according to claim 18, further comprising signal switching means for switching connections of said external terminals to said programmable logic section so that external signals are input from said external terminals to said programmable logic section and that output signals from said programmable logic section are output to said external terminals.

* * * * *